United States Patent [19]

Mitani et al.

[11] 4,343,986

[45] Aug. 10, 1982

[54] THERMAL PRINTHEAD

[75] Inventors: Masao Mitani; Toyoji Tsunoda; Tsuneyoshi Kawahito, all of Yokahoma; Tsuneaki Kamei, Kanagawa; Akira Yabushita, Yokohama, all of Japan

[73] Assignee: Hitachi, Ltd., Tokyo, Japan

[21] Appl. No.: 245,511

[22] Filed: Mar. 19, 1981

[30] Foreign Application Priority Data

Mar. 19, 1980 [JP] Japan .................................. 55/33890

[51] Int. Cl.³ .............................................. H05B 1/00
[52] U.S. Cl. .................................... 219/216; 219/543; 338/309; 346/76 PH
[58] Field of Search ................ 219/216, 543; 250/316; 338/308, 309; 252/512, 518; 346/76 PH; 427/126.2

[56] References Cited

U.S. PATENT DOCUMENTS

| 4,038,517 | 7/1977 | Nelson | 219/216 |
| 4,169,032 | 9/1979 | Haase et al. | 219/216 X |
| 4,203,025 | 5/1980 | Nakatami et al. | 219/216 |
| 4,232,213 | 11/1980 | Taguchi et al. | 219/216 |
| 4,259,564 | 3/1981 | Ohkubo et al. | 219/216 |

FOREIGN PATENT DOCUMENTS 51-27542 3/1976 Japan .

OTHER PUBLICATIONS

ITE Publication, "Evaluation of Life for Thermal Head", Tokunaga et al., Sep. 1979, vol. 3, No. 13, pp. 25–32.

Primary Examiner—Volodymyr Y. Mayewsky
Attorney, Agent, or Firm—Craig and Antonelli

[57] ABSTRACT

A thermal printhead comprising a substrate, heat generating thin film resistor bodies formed on the substrate and electric conductors for supplying the heat generating thin film resistor bodies with electric power, characterized in that the heat generating thin film resistor bodies are made of a Cr-Si alloy subjected to a stabilization aging heat treatment.

5 Claims, 5 Drawing Figures

THERMAL PRINTHEAD

BACKGROUND OF THE INVENTION

The present invention relates to a thermal printhead having heat generating resistor bodies consisting of thin film of a Cr-Si alloy subjected to a stabilization aging heat treatment.

The thermal printhead can be used, for example, in facsimiles. The thermal printer such as facsimile employs a thermal printhead constituted by a number of small heat generating resistor bodies arrayed in a row. The heat generating resistor bodies are connected to the conductor lines individually, which are adapted to supply signal currents to the heat generating resistor bodies in accordance with recording signals, so that the each heat generating resistor body generates heat selectively to effect a recording on a heat-sensitive recording paper which is held in contact with the thermal printhead.

The heat generating resistor body used as the constituent of thermal printhead can be broadly classified in accordance with the production method into two types, one is so-called thick film type while the other is so-called thin film type.

The heat generating resistor body of thick film type is produced by depositing a heat generating resistor body on an alumina substrate by a screen printing technique. The heat generating resistor body of thin film type is formed by depositing the heat generating resistor body by vacuum evaporation or sputtering on a ceramic substrate and then effecting a photo-etching.

The present invention relates to the thermal printhead of thin film type. Generally, the thermal printhead is required to meet various requirements. Namely, it is essential that the heat generating resistor bodies are stable to exhibit small fluctuation in the resistance value. In addition, since the heat generating resistor bodies are repeatedly heated to high temperatures during the recording, the heat generating resistor body should exhibit a high resistance against oxidation and small change in resistance value. Furthermore, it is important that the heat generating resistor body can operate at a high response speed in response to the recording signal. In other words, the temperature of the heat generating resistor should rise and fall sharply in response to the rise and fall of the recording pulse signal.

The thermal printhead for use in the thermal printer has a construction which includes a substrate made of a material having both of high electric insulating ability and smoothness of surface, such as glazed alumina ceramic substrate, a multiplicity of heat generating resistor bodies in the form of thin films formed on the substrate, and electric conductors for supplying the heat generating resistor bodies with the electric power. In operation, pulse current is supplied through the electric conductors to the heat generating resistor bodies corresponding to the recording signals to obtain the required heat pulse in accordance with the recording signal. The heat generating resistor bodies supplied with the electric current are activated to generate the heat to make a recording on the heat-sensitive recording paper which is held in contact with the thermal printhead.

Hitherto, the heat generating resistor bodies of the thermal printhead are made from tantalum nitride, tantalum silicon or the like materials to have a form of thin film. This heat generating resistor body of thin film type, however, is drastically oxidized at a high temperature in excess of 200° C. to increase the resistance value, resulting in a degraded thickness of the printing. In order to obviate this problem, it has been proposed to coat the resistor body with an anti-oxidation protecting layer of silicon oxide ($SiO_2$) or the like and to cover this layer with a wear resistant layer such as of tantalum oxide ($Ta_2O_5$). This improved heat generating resistor body, however, cannot provide a sufficiently high stability in resistance value when it is driven for a long period of time.

In the meantime, there is an increasing demand for a high-speed facsimile. To cope with this demand, it is necessary that the thermal printhead operates with driving pulses of shorter pulse widths. This means that the instantaneous driving electric power is increased as compared with conventional devices, and the thin film type heat generating resistor body must produce required heat in a shorter period of time, resulting in an elevated operation temperature. Unfortunately, however, the conventional thermal printhead cannot be used practically for a satisfactorily long period of time under such a severe condition of use.

SUMMARY OF THE INVENTION

It is, therefore, a principal object of the invention to provide a thermal printhead having heat generating thin film resistor bodies, in which the heat generating resistor bodies have a sufficiently high resistance against oxidation and can exhibit a constant resistance value stably over a long period of time under a high speed operation of the thermal printhead and prolonged life of the same, thereby to obviate the above-described problems in the prior arts.

As a result of intense studies and experiments, the present inventors have found that the above-mentioned object of the invention can be achieved by using, as the material of the heat generating thin film resistor bodies, thin films of a Cr-Si alloy subjected to a stabilization aging heat treatment, in place of the conventional material such as tantalum nitride, tantalum silicon and the like. The surface of the heat generating thin film resistor body faced to the heat-sensitive recording paper is coated with a wear resistant layer.

According to an aspect of the invention, there is provided a thermal printhead comprising a substrate, heat generating thin film resistor bodies formed on the substrate and electric conductors for supplying the heat generating thin film resistor bodies with electric power, characterized in that the heat generating thin film resistor bodies are made of a Cr-Si alloy subjected to a stabilization aging heat treatment.

According to another aspect of the invention, there is provided a thermal printhead comprising a substrate, heat generating thin film resistor bodies formed on the substrate, electric conductors for supplying the heat generating thin film resistor bodies with electric power and a wear resistant layer formed to cover the heat generating thin film resistor bodies, characterized in that the heat generating thin film resistor bodies are made of a Cr-Si alloy subjected to a stabilization aging heat treatment.

DESCRIPTION OF THE PREFERRED EMBODIMENTS

The invention will be fully described hereinunder with specific reference to the accompanying drawings.

Figure 1:
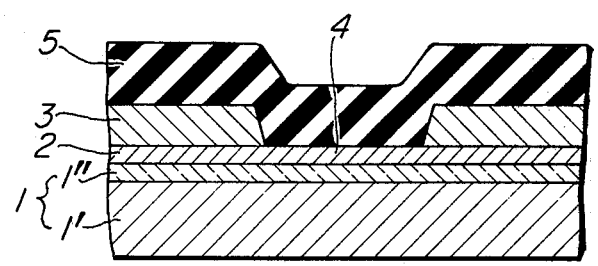
FIG. 1 is a sectional view of an essential part of a thermal printhead in accordance with the invention.

Referring first to FIG. 1 showing in section an essential part of a thermal printhead in accordance with the invention, a substrate 1 is made of an electrically insulating material such as grazed ceramic. More specifically, in the illustrated embodiment, the substrate 1 is constituted by a ceramic layer 1' and a glass layer 1" formed onto the latter. On the substrate 1, formed are a plurality of heat generating thin film resistor bodies 2 made of a Cr-Si alloy and electric conductors 3 for supplying the heat generating resistor bodies 2 with electric power. The electric conductors 3 are made of a material having a high electric conductivity, such as Al, Au and the like, and are formed to have a predetermined pattern by a photo-etching technique. In this state, the assembly including the substrate 1, heat generating thin film resistor bodies 2, and the conductors 3 is subjected to a heat treatment to stabilize the heat generating thin film resistor bodies 2 by an aging effect.

Figure 2:
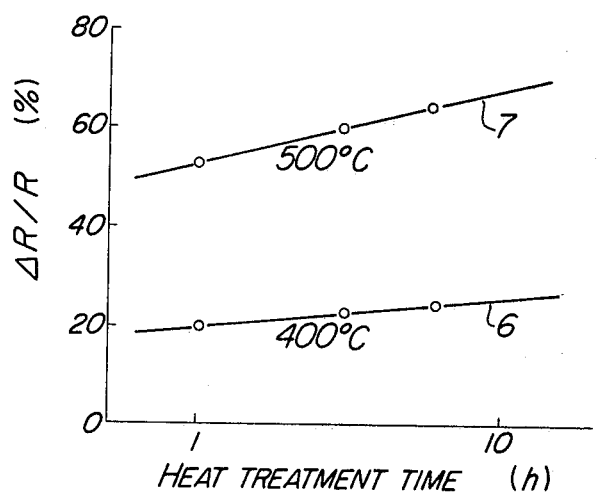
FIG. 2 is a graph showing the aging properties of the thermal printhead in accordance with the invention.

FIG. 2 shows how the resistance value of the heat generating thin film resistor bodies is changed by this heat treatment. More specifically, in FIG. 2, the axis of ordinate represents the ratio $\Delta R/R$, where R represents the resistance value of the heat generating thin film resistor body before the heat treatment, while $\Delta R$ represents the difference in the resistance value of the heat generating resistor body between the state before the heat treatment and the state after the heat treatment. Curves denoted by reference numerals 6 and 7 show, respectively, the changes in the resistance values when the heat treatment is effected in the air atmosphere at temperatures of 400° C. and 500° C. By way of reference, the heat treatment was conducted in nitrogen gas and under a vacuum condition, respectively, but the property observed was essentially equivalent to that obtained when the heat treatment is effected in the air atmosphere.

The most remarkable feature of this material resides in the fact that it exhibits a high stability in the resistance value. Namely, the heat generating resistor body having subjected to the heat treatment at 500° C. for one hour shows, when left in the air atmosphere in the naked state at 450° C. for 130 hours, an extremely small change in resistance value amounting to ±0.5% or less with respect to the initial resistance value.

The normally experienced maximum temperature in the thermal printhead of high speed facsimile usually ranges between 300° and 350° C., although it depends on the nature of the heat-sensitive recording paper used. Therefore, as will be understood also from FIG. 2, it is sufficient if a 30 to 60 minutes heat treatment at a temperature about 50° C. higher than the above-mentioned maximum temperature during operation is effected. If the pulse width of the driving pulse is reduced to obtain a higher operation speed of the facsimile, the maximum temperature in the thermal printhead will be increased correspondingly. In such a case, it will be necessary to increase the heat treatment temperature accordingly.

Referring again to FIG. 1, a portion denoted by the reference numeral 4 is a heat generating resistor body after being subjected to the above-described heat treatment, while a reference numeral 5 denotes a protecting layer covering the heat generating resistor bodies 2 and the electric conductors 3. The protecting layer 5 is made of silicon oxide, alumina, tantalum oxide or the like material or can have a multi-layered structure consisting of layers of these materials. It will be seen that this protecting layer 5 ensures a longer life of the thermal printhead.

The formation of the thin film of the Cr-Si alloy can be made by various known methods such as sputtering, electron beam evaporation, resistance heating evaporation and so forth. However, for an easier control of the formation, the sputtering is preferred. This sputtering can be conducted in various ways: (a) to use an alloy target formed beforehand at a predetermined alloy ratio; (b) to use a target including a Cr target and thin strips of Si arranged on the Cr target in the form of stripes at a predetermined pitch; and (c) to use a target having strips of Cr arranged in the form of stripes on the Si target.

In the case where the alloy ratio of the Cr-Si alloy to be formed is given, it is preferred to form, in the Cr target or Si target used in the method (b) or (c) above, grooves for embedding the strips of Si or Cr.

Figure 3:
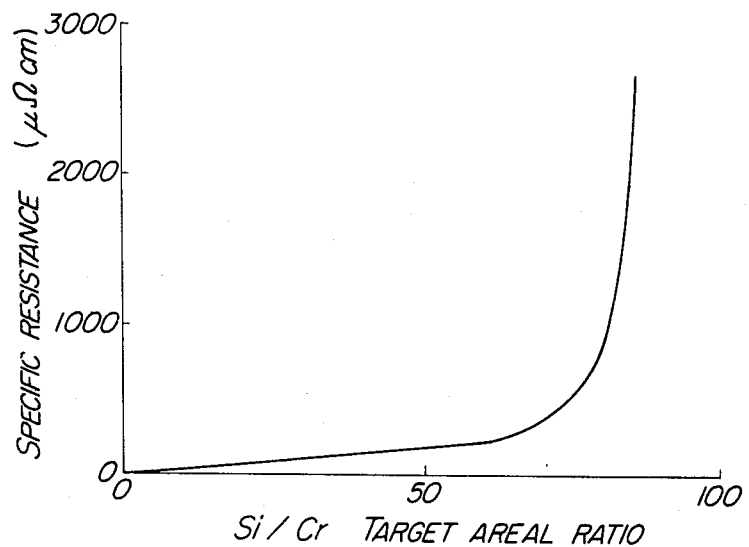
FIG. 3 is a graph showing the property of a thin film of a Cr-Si alloy used in the invention, in the state before being subjected to a heat treatment.

FIG. 3 shows, by way of example, the relationship between the Si/Cr target areal ratio (axis of abscissa) and the specific resistance of a thin film of a Cr-Si alloy formed by a sputtering. From this Figure, it will be understood that a practically usable specific resistance value can be selected within the range of between 100 $\mu\Omega$cm and 2000 $\mu\Omega$cm. The curves 6 and 7 in FIG. 2 show examples of the change in the resistance value as observed when the alloy containing 80% Si (areal ratio) is subjected to the heat treatment. It will be seen that the specific resistance value after the heat treatment is increased to about 1.5 times as high as the initial resistance value, although it depends on various factors such as alloy ratio, heat treatment temperature, heat treatment time, heat treatment atmosphere and so forth. This property is quite favourable as the material of the heat generating resistor body.

By the way, if the heat treatment is conducted at a temperature higher than 500° C. after the formation of the wiring conductors, mutual diffusion takes place between the heat generating resistor bodies of the Cr-Si alloy and the wiring conductors to double the resistance value of the wiring conductor. Although the thermal printhead is operable with such wiring conductors having increased resistance value, it is preferred to interpose a diffusion preventing metallic layer (or a compound layer) between the thin film of Cr-Si alloy and the wiring conductors, if it is strictly required to eliminate the mutual diffusion.

For example, in a case where the wiring conductors are made of Al, the increase in the resistance of the wiring conductors is limited to 20% at the greatest after a 1-hour heat treatment at 500° C., if a Cr thin film having a thickness of 1000 to 2000 Å is used as the barrier layer between the wiring conductor layer and Cr-Si alloy layer.

In the illustrated embodiment, the wiring conductor is formed to have a double-layer structure of Al/Cr and, after the formation of the wiring conductors and heat generating resistor bodies (90 μm wide×280 μm long×1000 Å thick) in the pattern of 8 dots/mm, the assembly was subjected to a 1-hour heat treatment at 500° C. The increase in the resistance of the Al wire was as small as 15%.

Figure 4:
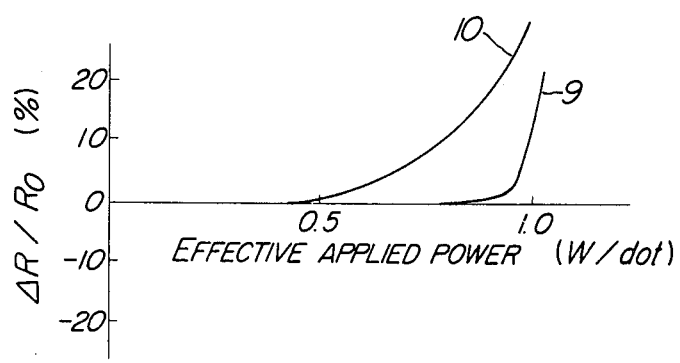
FIG. 4 is a graph showing the advantage of the invention.

A thermal printhead was made by providing a standard protecting layer (SiO$_2$ 2 μm thick/Ta$_2$O$_5$ 5 μm thick) on these heat generating resistor bodies and the wiring conductors. An acceleration test was conducted with this thermal printhead by applying rectangular pulse voltage of a pulse width 0.9 ms at a repetition frequency of 100 Hz for 20 minutes and measuring the rate of change in the resistance in relation to the initial resistance value, while increasing the applied power in a stepped manner at a rate of 0.1 W. The result of this test is shown at curve 9 in FIG. 4. In this Figure, the axis of absicissa shows the applied power (W/dot) while the axis of ordinate represents the ratio $\Delta R/R_o$, where $R_o$ represents the initial resistance value while $\Delta R$ shows the difference between the resistance value observed after the application of the power and the initial resistance value $R_o$. In FIG. 4, the curve 10 shows the result of an acceleration test conducted with a thermal printhead having a thin film resistor body made of a conventional material Ta$_2$N which has been considered to have a comparatively good properties. This resistor body was formed to have the same shape and size as that in the thermal printhead of the invention.

From FIG. 4, it will be seen that the thermal printhead of the invention is remarkably improved in the aspect of degradation of resistors, as compared with the conventional printhead. This fact coincides with the aforementioned fact that the material used in the present invention has a high resistance against oxidation.

As has been described, the heat generating resistor body in the thermal printhead of the invention basically shows no degradation due to oxidation. Therefore, the SiO$_2$ film specifically intended for prevention of oxidation can be omitted, provided that the protecting layer of Ta$_2$O$_5$ is used merely as an antidefacing layer.

In fact, the same property as that shown by curve 9 in FIG. 4 was observed as a result of an acceleration test which was conducted with a thermal printhead in which a Ta$_2$O$_5$ layer of 5 μm thick was formed as a sole protecting layer.

The elimination of the SiO$_2$ film provides various advantages such as simplification of the process of production of the thermal printhead, reduction in the production cost and improvement in the printing thermal efficiency. In the case of the thermal printhead having the Ta$_2$O$_5$ layer, the improvement in the thermal efficiency well reaches about 5%. Also, a thermal printhead having a protecting layer of Al$_2$O$_3$ (5 μm thick) having a high heat conductivity achieves a remarkable improvement in efficiency well reaching 15% over the thermal printhead having the aforementioned doublelayered structure (SiO$_2$/Ta$_2$O$_5$) of the protecting layer.

Such a remarkable improvement in the efficiency also owes to the use of the heat generating resistor body in accordance with the invention.

A thermal printhead was produced in the same manner using a Cr-65%Si composition (target areal ratio). This thermal printhead showed a property essentially equivalent to that showed by the curve 9 in FIG. 4. In this thermal printhead, the specific resistance of the heat generating resistor body after the heat treatment was as low as about 500 μΩcm. The compositions around Cr-80%Si (target areal ratio) showed the highest practicality.

Figure 5:
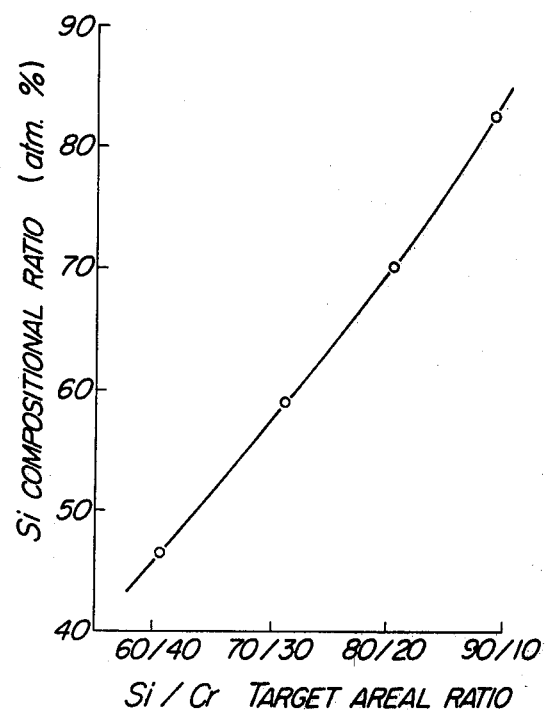
FIG. 5 is a graph showing the result of chemical analysis of a thin film of a Cr-Si alloy formed by a sputtering.

FIG. 5 shows the result of a chemical analysis of a Cr-Si alloy film formed by a sputtering within the range of Si/Cr target areal ratio of between 60/40 and 90/10. A 20 to 10% shift in Si compositional ratio in deposited film toward the Si poor side from the target areal ratio was observed. This is attributable to the difference in the sputter rate depending on the substance to be sputtered by argon ions. The Auger analysis result showed uniformity in the thicknesswise direction of the film. It was also confirmed that a certain amount of oxygen is contained uniformly.

The result of Auger analysis after the heat treatment perfectly coincided with that observed before the heat treatment. This tells the fact that the change in resistance value as shown in FIG. 2 is attributable to the property peculiar to the thin film itself of Cr-Si alloy but not to other reason such as surface oxidation. The detailed mechanism of this resistance change, however, has not been clarified yet.

By way of reference, even if the heat treatment for stabilizing the Cr-Si thin film is conducted in the state shown in FIG. 1, i.e. after the formation of the protecting layer, a life property is essentially equivalent to those of the described embodiments. This is theoretically supported by the fact that the results of Auger analysis before and after the heat treatment coincides with each other. Accordingly, the degree of freedom in the production process is increased advantageously.

What is claimed is:

1. A thermal printhead comprising a substrate, heat generating thin film resistor bodies formed on said substrate and electric conductors for supplying said heat generating thin film resistor bodies with electric power, characterized in that said heat generating thin film resistor bodies are made of a Cr-Si alloy subjected to a stabilization aging heat treatment.

2. A thermal printhead as claimed in claim 1, wherein said Cr-Si alloy subjected to said heat treatment consists essentially of 50 to 75 atm.% of Si and the balance Cr.

3. A thermal printhead comprising a substrate, heat generating thin film resistor bodies formed on said substrate, electric conductors for supplying said heat generating thin film resistor bodies with electric power and a wear resistant layer formed to cover said heat generating thin film resistor bodies, characterized in that said heat generating thin film resistor bodies are made of a Cr-Si alloy subjected to a stabilization aging heat treatment.

4. A thermal printhead as claimed in claim 3, wherein said Cr-Si alloy subjected to said heat treatment consists essentially of 50 to 75 atm.% of Si and the balance Cr.

5. A thermal printhead as claimed in claim 1, wherein said heat treatment is conducted for 30 to 60 minutes in the atmosphere of air, oxygen or nitrogen at a temperature which is, at the highest, 50° C. higher than the maximum normal operation temperature of said thermal printhead.

* * * * *

UNITED STATES PATENT AND TRADEMARK OFFICE
CERTIFICATE OF CORRECTION

PATENT NO. : 4,343,986
DATED : August 10, 1982
INVENTOR(S) : Masao Mitani, Tsuneyoshi Kawahito,
Tsuneaki Kamei and Akira Yabushita It is certified that error appears in the above-identified patent and that said Letters Patent are hereby corrected as shown below:

Claim 5, line 3, change the word "oxygen" to --vacuum--.

Signed and Sealed this

Twentieth Day of December 1983

[SEAL]

Attest:

GERALD J. MOSSINGHOFF

Attesting Officer

Commissioner of Patents and Trademarks